(12) United States Patent
Kim

(10) Patent No.: US 7,151,032 B2
(45) Date of Patent: Dec. 19, 2006

(54) METHODS OF FABRICATING SEMICONDUCTOR DEVICES

(75) Inventor: Hag Dong Kim, Suwon-si (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 39 days.

(21) Appl. No.: 11/021,731

(22) Filed: Dec. 23, 2004

(65) Prior Publication Data
US 2005/0136607 A1 Jun. 23, 2005

(30) Foreign Application Priority Data
Dec. 23, 2003 (KR) ............... 10-2003-0095279

(51) Int. Cl.
*H01L 21/336* (2006.01)
(52) U.S. Cl. ............... 438/286; 438/300; 438/301
(58) Field of Classification Search .............. 438/286, 438/289, 301, 290, 291
See application file for complete search history.

(56) References Cited
U.S. PATENT DOCUMENTS

| | | | |
|---|---|---|---|
| 6,017,798 A * | 1/2000 | Ilderem et al. | ............ 438/286 |
| 6,194,278 B1 | 2/2001 | Rengarajan | |
| 6,362,054 B1 | 3/2002 | Choi et al. | |
| 6,518,136 B1 | 2/2003 | Lee et al. | |
| 6,555,437 B1 * | 4/2003 | Yu | ............ 438/300 |
| 6,579,751 B1 | 6/2003 | Tran | |
| 6,589,847 B1 | 7/2003 | Kadosh et al. | |

* cited by examiner

*Primary Examiner*—Walter L. Lindsay, Jr.
(74) *Attorney, Agent, or Firm*—Saliwanchik, Lloyd & Saliwanchik

(57) ABSTRACT

Methods of fabricating a semiconductor devices are disclosed. One example method includes forming a gate insulating layer and a gate electrode on a semiconductor substrate; forming first halo implant regions under the gate electrode in the semiconductor substrate by implanting first conduction type impurities; forming low concentration impurity regions for LDD regions under sides of the gate electrode in the semiconductor substrate by implanting second conduction type impurities at a low concentration; forming second halo implant regions under sides of the gate electrode in the semiconductor substrate by implanting first conduction type impurities; forming high concentration impurity regions for source/drain regions in the semiconductor substrate by implanting second conduction type impurities; and forming junction compensation ion regions between the high concentration impurity regions and the second halo implant regions by implanting first conduction type impurities.

6 Claims, 3 Drawing Sheets

METHODS OF FABRICATING SEMICONDUCTOR DEVICES

TECHNICAL FIELD

The present disclosure generally relates to semiconductor devices and, more particularly, to methods of fabricating semiconductor devices.

BACKGROUND

As semiconductor devices are highly integrated, the sizes of such devices are also reduced. This size reduced semiconductor has resulted in a reduction in channel length of a semiconductor device. However, the reduction in the channel length may cause undesired electrical characteristics such as a short channel effect. To obviate the short channel effect, vertical reductions such as reduction in the thickness of a gate insulating layer and the depth of source/drain junctions as well as horizontal reductions such as reduction in the length of a gate electrode have to be achieved. According to the vertical and horizontal reductions, a low voltage has to be applied to a semiconductor device and a high dopant concentration in a semiconductor substrate is required. In addition, the doping profile in a channel region has to be effectively controlled.

However, the voltage used to operate electronics has not been lowered yet although the size of semiconductor devices have considerably been reduced. Therefore, for example, in an metal-oxide semiconductor (N-MOS) transistor, the electrons implanted into a source region are rapidly accelerated due to the high potential gradient of a drain region, thereby causing hot carriers. To obviate such generation of hot carriers, a lightly doped drain (LDD) structure has been suggested. In a transistor with LDD regions, low concentration (n-) regions are positioned between a channel region and high concentration (n-) source/drain regions. The low concentration (n-) regions absorb a high drain voltage around the source/drain regions to obviate a sharp potential gradient, thereby suppressing the generation of hot carriers. With the development of high-integration semiconductor device technology, various technologies of fabricating a metal oxide semiconductor field effect transistor (MOSFET) with LDD regions have been developed. Particularly, one of the technologies most widely used is a method of forming LDD regions after spacers are formed on the sidewalls of a gate electrode.

However, with a continual high-integration of semiconductor devices, just the LDD structure alone could not sufficiently control short channel effects; the spacer fabrication cannot be controlled. Therefore, a halo implant process has been suggested to prevent the source/drain depletion regions from being horizontally closer together while the doping concentration of a channel region, which determines the threshold voltage of a transistor, is not influenced.

The halo implant process forms halo structures around the source/drain regions by implanting impurities with the opposite type to that of impurities in the source/drain regions into the substrate around the source/drain regions. In other words, by surrounding diffusion regions, which have a higher imparity concentration than that of peripheral well regions, around the source/drain regions, the halo implant process reduces the length of source/drain depletion regions.

However, in performing a conventional halo implant process to fabricate a MOS transistor, the impurities doped into the source/drain regions, such as baron or phosphorus, may be diffused into a channel region when a thermal treatment process is performed to form source/drain junctions. Such impurities diffused into the channel region deteriorate the electric characteristics of the MOS transistor. In other words, because the threshold voltage of the MOS transistor changes from an original desired value due to the diffused impurities, it is difficult to distinguish sharply between turn-off and turn-on operations of the MOS transistor. Therefore, the malfunction of the MOS transistor and an increase in a leakage current are caused.

In addition to the short channel effect, the high-integration of semiconductor devices may induce the occurrence of a leakage current and an increase in contact resistance. Moreover, parasitic resistances, which are formed in a semiconductor substrate and a gate electrode, may deteriorate the electric characteristics of a device.

DETAILED DESCRIPTION

Figure 1A:
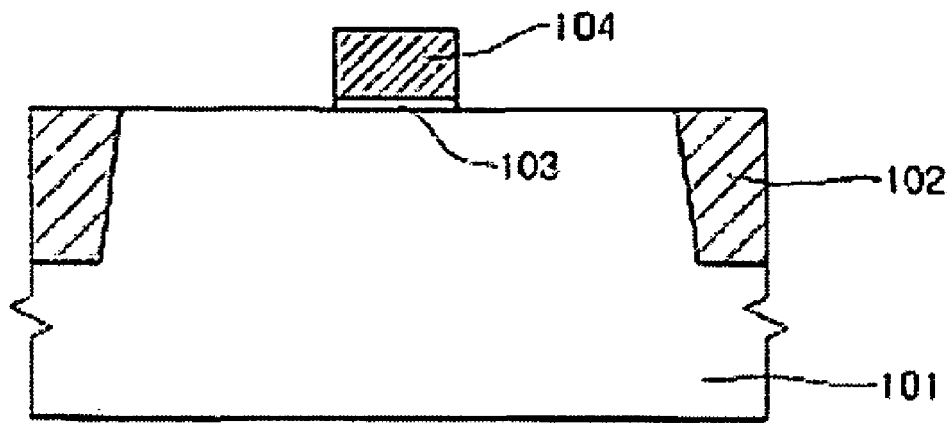
FIGS. 1a through 1f are cross-sectional views illustrating semiconductor devices at various stages of fabrication according to the processes disclosed herein.

Referring to FIG. 1a, device isolation layers 102 are formed in field regions of a semiconductor substrate 101 to define an active region by performing an isolation process, for example, a shallow trench isolation (STI) process. The semiconductor substrate 101 may be a single crystal silicon substrate of a first conduction type, which may be an n-type or a p-type. In the illustrated example process, the first conduction type is defined as an n-type.

After the isolation process, an oxide layer for a gate insulating layer is grown on the surface of the semiconductor substrate 101. Subsequently, impurities, for example, $BE_2$ ions, may be implanted into the substrate around the surface of the semiconductor substrate 101 to adjust the threshold voltage of a channel region. Next, a conductive layer for a gate electrode is deposited on the oxide layer. The conductive layer and the oxide layer are then etched by using a photolithography process to form a gate electrode 104 and a gate insulating layer 103 on the active region of the semiconductor substrate 101.

Figure 1B:
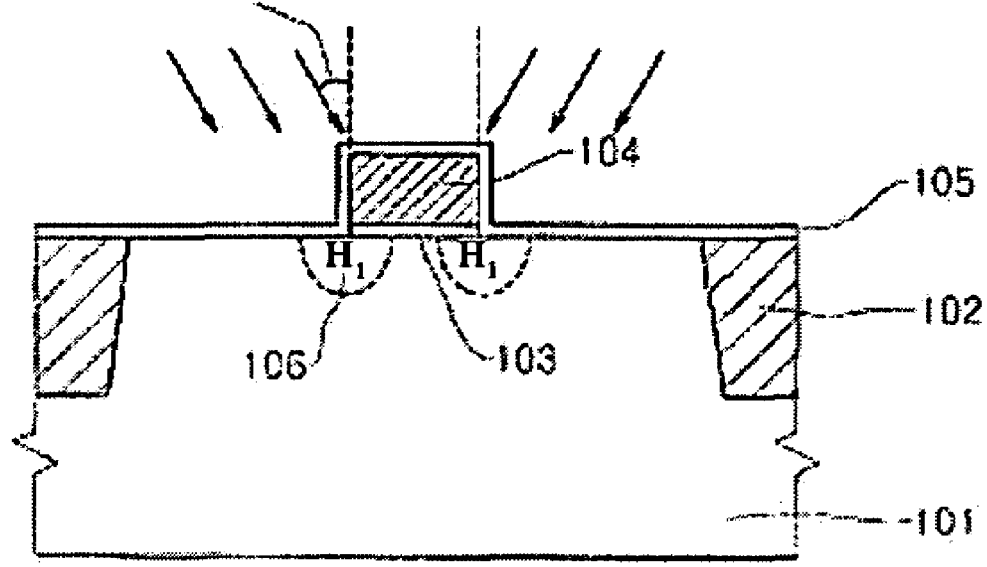

Referring to FIG. 1b, a buffer oxide layer 105 to minimize the damage of the semiconductor substrate 101 due to later ion implantations is deposited on the semiconductor substrate including the gate electrode 104. The buffer oxide layer 105 has a thickness between about 50 Å and about 100 Å. A first halo implant process is then performed. In detail, halo ions, first conductive type (n-type) impurities such as arsenic ions are implanted into the semiconductor substrate 101 with a dose that ranges from about $1.0 \times 10^{13}$ ions/cm$^2$ to about $5.0 \times 10^{14}$ ions/cm$^2$ at an implant energy ranging from about 10 kilo electron-Volts (keV) to about 50 keV. As a result, first halo implant regions (H1) 106 are formed under the gate electrode 104 in the semiconductor substrate 101. In the illustrated example, the impurity ions are implanted at an angle between about 20° and about 40° with respect to the direction perpendicular to the surface of the semiconductor substrate 101.

Figure 1C:
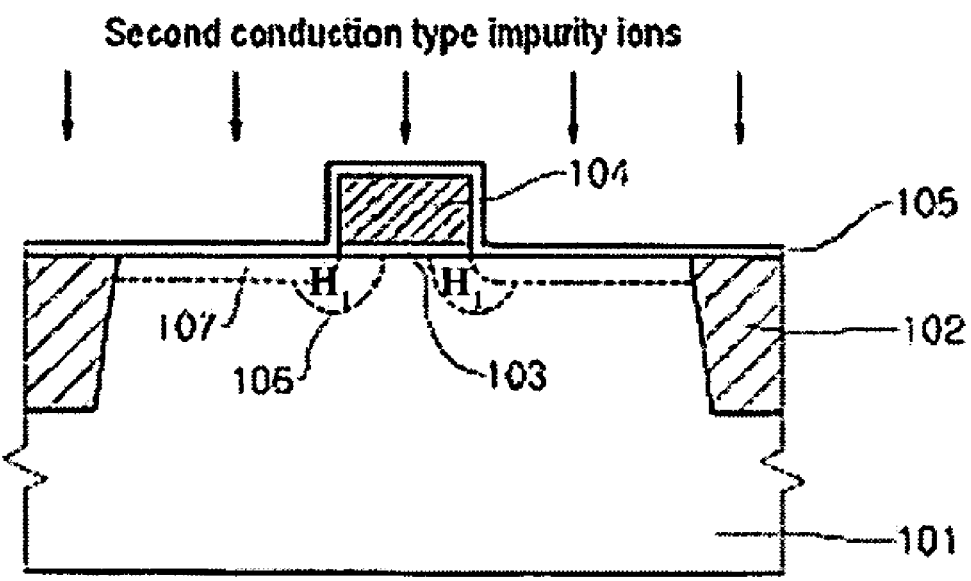

Referring to FIG. 1c, a low concentration ion implantation process is performed to form low concentration impurity regions 107 for LDD regions under sides of the gate electrode 104 in the semiconductor substrate 101. In detail, second conduction type impurity ions, for example, p-type boron ions, are implanted into the active region of the semiconductor substrate 101 with a dose that ranges from about $1.0 \times 10^{14}$ ions/cm$^2$ to about $1.0 \times 10^{15}$ ions/cm$^2$ at an implant energy ranging from about 10 keV to about 50 keV.

Subsequently, a thermal treatment process is performed for the semiconductor substrate 101 to activate the impurities in the first halo implant regions (H1) 106 and the low concentration impurity regions 107. The thermal treatment may be a rapid thermal treatment which is performed at a temperature between about 800° C. and about 1000° C. for about 10 seconds to about 30 seconds under an inert gas atmosphere. The inert gas may be nitrogen gas.

Figure 1D:
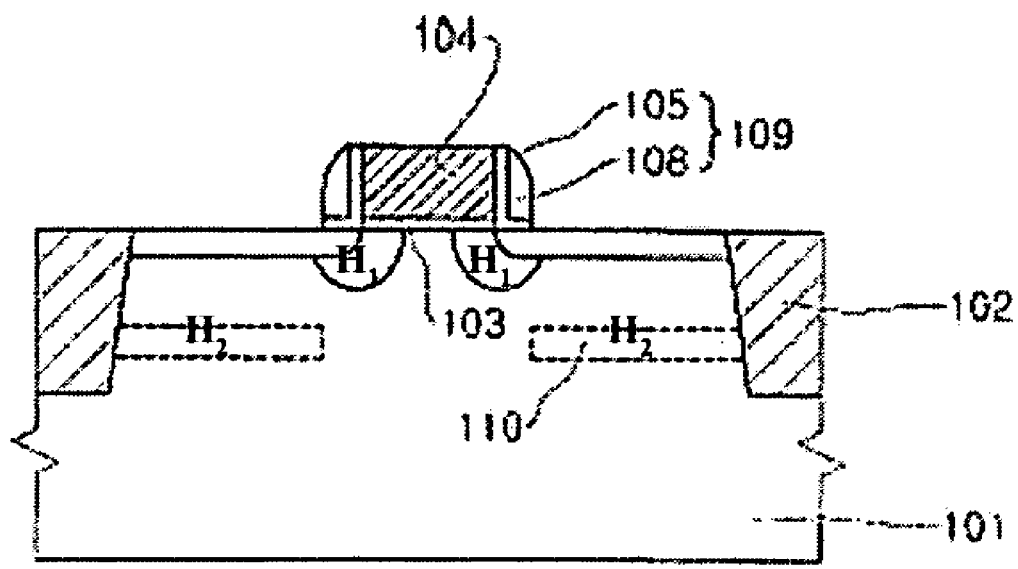

Referring to FIG. 1d, a nitride layer 108 is deposited on the buffer oxide layer 105. In one example, the nitride layer 108 has a thickness between about 500 Å and about 1500 Å. An etch-back process is then performed to dry-etch the nitride layer 108 until the buffer oxide layer 105 on the semiconductor substrate 101 is exposed. The etch-back process may be a reactive ion etching (RIE) with anisotropic etching characteristics. As a result, the nitride layer 108 remains only on the sidewalls of the gate electrode 104. Subsequently, the buffer oxide layer 105 is dry-etched until the surface of the semiconductor substrate 101 is exposed. As a result, spacers 109 formed from the nitride layer 108 and the buffer oxide layer 105 are formed on the sidewalls of the gate electrode 104.

Next, a second halo implant process is performed to form second halo implant regions to prevent a leakage current and punch-through. In detail, first conduction type (n-type) impurities, for example, arsenic ions are implanted into the semiconductor substrate 101 with a dose that ranges from about $5.0 \times 10^{13}$ ions/cm$^2$ to about $5.0 \times 10^{14}$ ions/cm$^2$ at an implant energy ranging from about 5 keV to about 50 keV. As a result, second halo implant regions (H2) 110 are formed under sides of the gate electrode 104 in the semiconductor substrate 101. In the illustrated example, the impurity ions are implanted at right angle to the semiconductor substrate 101. By forming the second halo implant regions (H2) 110 in the semiconductor substrate, the punch-through between a source region and a drain region is prevented.

Figure 1E:
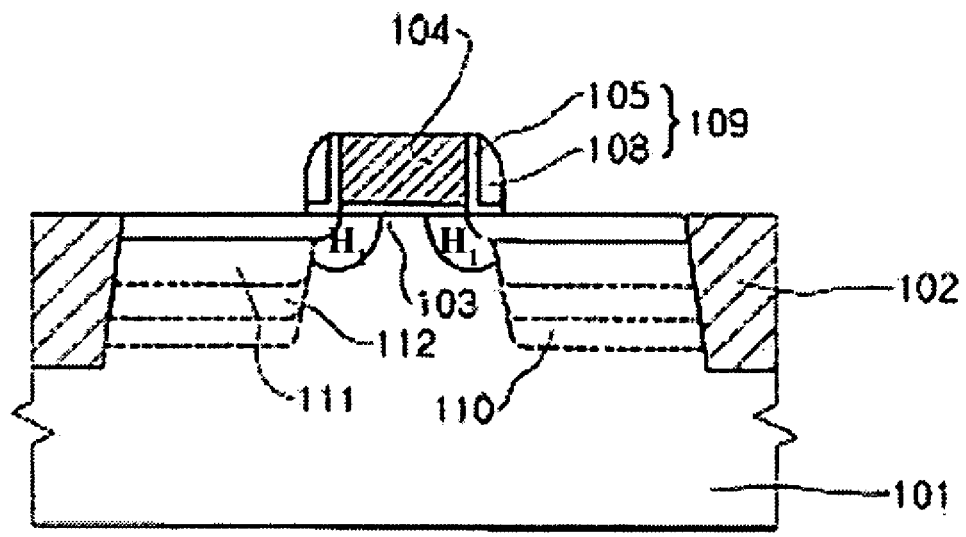

Referring to FIG. 1e, a high concentration ion implantation process is performed to form source/drain regions in the semiconductor substrate. In detail, second conduction type (p-type) impurity ions, for example, B+ or BF$_{2+}$ ions, are implanted into the semiconductor substrate 101 to form high concentration impurity regions 111. The impurity ions are implanted with a dose that ranges from about $1.0 \times 10^{15}$ ions/cm$^2$ to about $5.0 \times 10^{15}$ ions/cm$^2$ at an implant energy ranging from about 3 keV and about 50 keV. Subsequently, junction compensation ion regions (Jcomp) 112 are formed in the semiconductor substrate 101 between the high concentration impurity regions 111 and the second halo implant regions (H2) 110.

The junction compensation ion regions 112 are formed additionally to the second halo implant regions (H2) 110 to prevent the punch-through between the source region and the drain region. In detail, first conduction type (n-type) impurities, for example, phosphorus ions are implanted into the semiconductor substrate 101 with a dose that ranges from about $1.0 \times 10^{14}$ ions/cm$^2$ to about $1.0 \times 10^{15}$ ions/cm$^2$ at an implant energy ranging from about 10 keV to about 60 keV. Particularly, the second halo ion implantation has to be performed by controlling the implant energy so that the junction compensation ion regions formed are not overlapped with the second halo implant regions (H2) 110 and/or the high concentration impurity regions 111. By forming the junction compensation ion regions 112 between the second halo implant regions (H2) 110 and the high concentration impurity regions 111, the illustrated example process obviates the generation of the leakage current between the source region and the drain region.

Figure 1F:
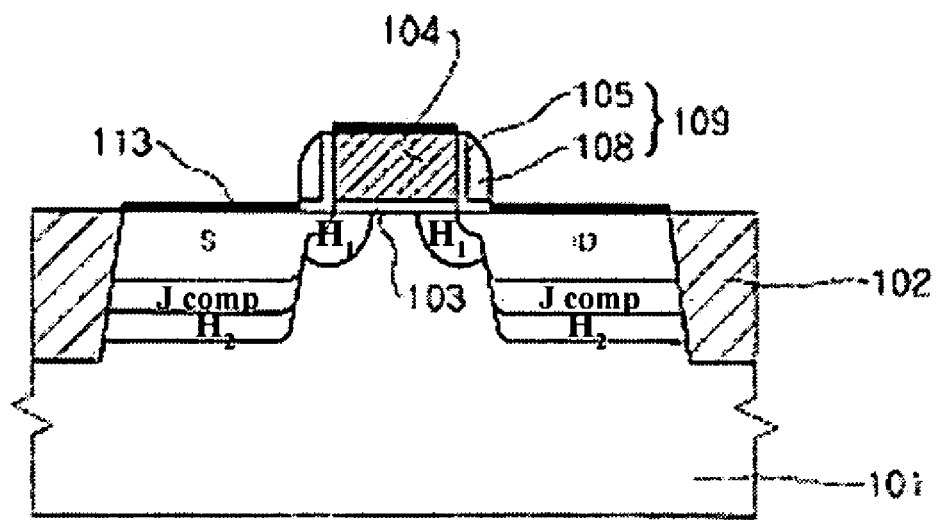

Referring to FIG. 1f, a thermal treatment process is performed for the semiconductor substrate 101 to activate the impurities in the second halo implant regions (H2) 110, the high concentration impurity regions 111, and the junction compensation ion regions 112. The thermal treatment process may be a rapid thermal treatment which is performed at a temperature between about 900 ° C. and about 1050 ° C. for about 10 seconds to about 30 seconds under an inert gas atmosphere. The inert gas may be nitrogen gas. Subsequently, after high fusion point metal is deposited over the resulting structure by performing a sputtering process, a self-aligned suicide (salicide) process is performed to form a salicide layer 113 on the top surface of the gate electrode 104 and on the source/drain regions. The salicide layer 113 may be formed of $MoSi_2$, $PdSi_2$, $PtSI_2$, $TaSi_2$, or $WSi_2$, based on the high fusion point metal deposited.

From the foregoing, persons of ordinary skill in the art will appreciate that by forming first halo implant regions under a gate electrode in a semiconductor substrate and forming source and drain regions, junction compensation ion regions, and second halo implant regions under sides of the gate electrode in the semiconductor substrate, the processes disclosed herein minimize punch-through between the source region and the drain region and improve the electric characteristics of a semiconductor device.

It is noted that this patent claims priority from Korean Patent Application Serial Number 10-2003-0095279, which was filed on Dec. 23, 2003, and is hereby incorporated by reference in its entirety.

Although certain example methods, apparatus and articles of manufacture have been described herein, the scope of coverage of this patent is not limited thereto. On the contrary, this patent covers all methods, apparatus, and articles of manufacture fairly falling within the scope of the appended claims either literally or under the doctrine of equivalents.

What is claimed is:

1. A method of fabricating a semiconductor device comprising:
    forming a gate insulating layer and a gate electrode on a semiconductor substrate;
    forming first halo implant regions under the gate electrode in the semiconductor substrate by implanting first conduction type impurities;
    forming low concentration impurity regions for LDD regions under sides of the gate electrode in the semiconductor substrate by implanting second conduction type impurities at a low concentration;
    forming second halo implant regions under sides of the gate electrode in the semiconductor substrate by implanting first conduction type impurities;
    forming high concentration impurity regions for source/drain regions in the semiconductor substrate by implanting second conduction type impurities; and
    forming junction compensation ion regions between the high concentration impurity regions and the second halo implant regions by implanting first conduction type impurities.

2. A method as defined by claim 1, wherein forming first halo implant regions is performed by implanting first conduction type impurities at an angle between about 20° and about 40° with respect to the direction perpendicular to the surface of the semiconductor substrate.

3. A method as defined by claim 2, wherein forming first halo implant regions is performed by implanting first conduction type impurities with a dose that ranges from about $1.0 \times 10^{13}$ ions/cm$^2$ to about $5.0 \times 10^{14}$ ions/cm$^2$ at an implant energy ranging from about 10 keV to about 50 keV.

4. A method as defined by claim 1, wherein forming first halo implant regions is performed by implanting first conduction type impurities with a dose that ranges from about $1.0 \times 10^{13}$ ions/cm$^2$ to about $5.0 \times 10^{14}$ ions/cm$^2$ at an implant energy ranging from about 10 keV to about 50 keV.

5. A method as defined by claim 1, wherein forming second halo implant regions is performed by implanting first conduction type impurities with a dose that ranges from about $5.0 \times 10^{13}$ ions/cm$^2$ to about $5.0 \times 10^{14}$ ions/cm$^2$ at an implant energy ranging from about 5 keV to about 50 keV.

6. A method as defined by claim 1, wherein forming junction compensation ion regions is performed by implanting first conduction type impurities with a dose that ranges from about $1 \times 10^{14}$ ions/cm$^2$ to about $1 \times 10^{15}$ ions/cm$^2$ at an implant energy ranging from about 10 keV to about 60 keV.

* * * * *

UNITED STATES PATENT AND TRADEMARK OFFICE
CERTIFICATE OF CORRECTION

PATENT NO.         : 7,151,032 B2  
APPLICATION NO. : 11/021731  
DATED               : December 19, 2006  
INVENTOR(S)       : Hak Dong Kim Page 1 of 1

It is certified that error appears in the above-identified patent and that said Letters Patent is hereby corrected as shown below:

Column 1,
Line 19, "ofsource/drainjunction" should read --of source/drain junction--.

Column 2,
Line 36, "$BE_2$ ions, may" should read --$BF_2$ ions, may--.

Column 4,
Line 15, "self-aligned suicide" should read --self-aligned silicide--.

Line 18, ", $PtSI_2$," should read --, $PtSi_2$,--.

Signed and Sealed this

Seventeenth Day of April, 2007

JON W. DUDAS  
*Director of the United States Patent and Trademark Office*